United States Patent [19]
Dubin et al.

[11] Patent Number: 5,891,513
[45] Date of Patent: *Apr. 6, 1999

[54] ELECTROLESS CU DEPOSITION ON A BARRIER LAYER BY CU CONTACT DISPLACEMENT FOR ULSI APPLICATIONS

[75] Inventors: Valery M. Dubin, Cupertino, Calif.; Yosef Shacham-Diamand, Ithaca, N.Y.; Chiu H. Ting, Saratoga, Calif.; Bin Zhao, Austin, Tex.; Prahalad K. Vasudev, Austin, Tex.

[73] Assignees: Cornell Research Foundation, Ithaca, N.Y.; Intel Corporation, Santa Clara, Calif.; Sematech, Inc., Austin, Tex.

[*] Notice: The term of this patent shall not extend beyond the expiration date of Pat. No. 5,674,487.

[21] Appl. No.: 587,262

[22] Filed: Jan. 16, 1996

[51] Int. Cl.$^6$ ...................................................... B05D 5/12
[52] U.S. Cl. ........................... 427/98; 427/305; 427/355; 427/427; 427/443.1; 438/631; 438/633; 438/678
[58] Field of Search ............................. 427/98, 305, 355, 427/427, 443.1; 438/631, 633, 678

[56] References Cited

U.S. PATENT DOCUMENTS

| | | | |
|---|---|---|---|
| 4,574,095 | 3/1986 | Baum et al. | 427/53.1 |
| 4,789,648 | 12/1988 | Chow et al. | 437/225 |
| 4,894,260 | 1/1990 | Kumasaka et al. | 427/241 |
| 4,985,750 | 1/1991 | Hoshino | 357/71 |
| 5,151,168 | 9/1992 | Gilton et al. | 205/123 |
| 5,240,497 | 8/1993 | Shacham et al. | 106/1.26 |
| 5,358,907 | 10/1994 | Wong | 437/230 |
| 5,674,787 | 10/1997 | Zhao et al. | 437/230 |

OTHER PUBLICATIONS

B. Luther et al., 1993 VMIC Conference, Jun. 8–9, 1993, pp. 15–21.
Palmans et al., Conf. Proc. ULSI–X, Materials Research Society, pp. 87–94, (no month) 1995.
Cho et al. MRS Bulletin, pp. 31–38, Jun. 1993.
Mak, MRS Bulletin, pp. 55–62, Aug, 1994.
"Copper Interconnection with Tungsten Cladding for ULSI"; J.S.H. Cho et al.; VLSI Tech. Symp.; 1991; pp. 39–40. (no month).
"Encapsulated Copper Interconnection Devices Using Sidewall Barriers;" Donald S. Gardner et al.; 1991 VMIC Conference; Jun. 11–12, 1991; pp. 99–108.
"Planar Copper–Polyimide Back End Of The Line Interconnections For ULSI Devices;" B. Luther et al.; 1993 VMIC Conference; Jun. 8–9, 1993; pp. 15–21.
"Electroless Cu for VLSI;" James S.H. Cho et al.; MRS Bulletin/Jun. 1993; pp. 31–38.
"Electroless Copper Deposition on Metals and Metal Silicides;" Cecilia Y. Mak; MRS Bulletin/Aug. 1994; pp. 55–62.

(List continued on next page.)

*Primary Examiner*—Michael Lusignan
*Assistant Examiner*—Timothy Meeks

[57] ABSTRACT

A method of utilizing electroless copper deposition to form interconnects on a semiconductor wafer. Once a via or a trench is formed in a dielectric layer, a titanium nitride (TiN) or tantalum (Ta) barrier layer is blanket deposited. Then, a contact displacement technique is used to form a thin activation seed layer of copper on the barrier layer. An electroless deposition technique is then used to autocatalytically deposit copper on the activated barrier layer. The electroless copper deposition continues until the via/trench is filled. Subsequently, the surface is polished by an application of chemical-mechanical polishing (CMP) to remove excess copper and barrier material from the surface, so that the only copper and barrier material remaining are in the via/trench openings. Then an overlying silicon nitride (SiN) layer is formed above the exposed copper in order to form a dielectric barrier layer. The copper interconnect is fully encapsulated from the adjacent material by the TiN (or Ta) and the SiN layers.

25 Claims, 7 Drawing Sheets

OTHER PUBLICATIONS

"Development Of An Electroless Copper Deposition Bath For Via Fill Applications On TiN Seed Layers;" Roger Palmans et al.; Conf. Proc. ULSI–X; Materials Research Society; 1995; pp.87–94. (no month).

"Selective and Blanket Electroless Cu Plating Initiated By Contact Displacement For Deep Submicron Via Contact Filling;" Dubin et al.; VMIC Conf.; Jun. 27–29, 1995; pp. 315–321.

"0.35 um Cu–Filled Via Holes By Blanket Deposited Electroless Copper On Sputtered Seed Layer;" Yosi Shacham–Diamand et al.; VMIC Conf.; Jun. 27–29, 1995; pp.334–336.

"Barriers Against Copper Diffusion into Silicon and Drift Through Silicon Dioxide;" Shi–Qing Wang; MRS Bulletin/ Aug. 1994; pp. 30–40.

"Inlaid Copper Multilevel Interconnections Using Planarization by Chemical–Mechanical Polishing;" S.P. Murarka et al.; MRS Bulletin/Jun. 1993; pp. 46–51.

"Electrochemically Deposited Diffusion Barriers;" M. Paunovic; et al.; J. Electrochem. Soc., vol. 141 No. 7; Jul. 1994; pp. 1843–1850.

"Electroless Copper Deposition For Multilevel Metallization;" S. Simon Wong et al.; Mat. Res. Soc. Symp. Proc. vol. 203; 1991 Materials Research Society; pp. 347–356. (no month).

"Electroless plating of copper at a low pH level;" R. Jagannathan et al.;IBM J. Res. Develop. vol. 37 No.2; Mar. 1993; pp. 117–123.

"Selective Electroless Metal Deposition for Integrated Circuit Fabrication;" Chiu H. Ting et al.; J. Electrochem. Soc. vol. 136, No.2; Feb. 1989; pp.456–462.

"Selective Electroless Metal Deposition for Via Hole Filling in VLSI Multilevel Interconnection Structures;" Chiu H. Ting et al.; J. Electrochem. Soc., vol. 136, No. 2; Feb. 1989; pp. 462–466.

"Pd/Si plasma immersion ion implantation for selective electroless copper plating on SiO2;" M.–H. Kiang et al.; Appl. Phys. Lett. 60 (22); Jun. 1, 1992; pp. 2767–2769.

"Selective electroless Ni deposition on a TiW underlayer for integrated circuit fabrication;" V.M. Dubin et al.; Thin Solid Films, 226(1993) ; pp. 87–93.

"Copper Corrosion With and Without Inhibitors;" V. Brusic et al.; J. Electrochem. Soc., vol. 138, No. 8; Aug. 1991; pp. 2253–2259.

"nm wide copper lines made by selective electroless deposition;" Yosi Shacham–Diamand; J. Micromech. Microeng. 1 (1991); pp. 66–72. (no month).

"Passivation of Copper by Silicide Formation In Dilute Silane;" S. Hymes et al.; Conf. Proc. ULSI–VII, Materials Research Society; 1992; pp. 425–431. (no month).

"A Half–Micron Pitch Cu Interconnection Technology;" Kazuyoshi Ueno et al.; 1995 Symposium on VLSI Technology Digest of Technical Papers; 1995; pp. 27–28. (no month).

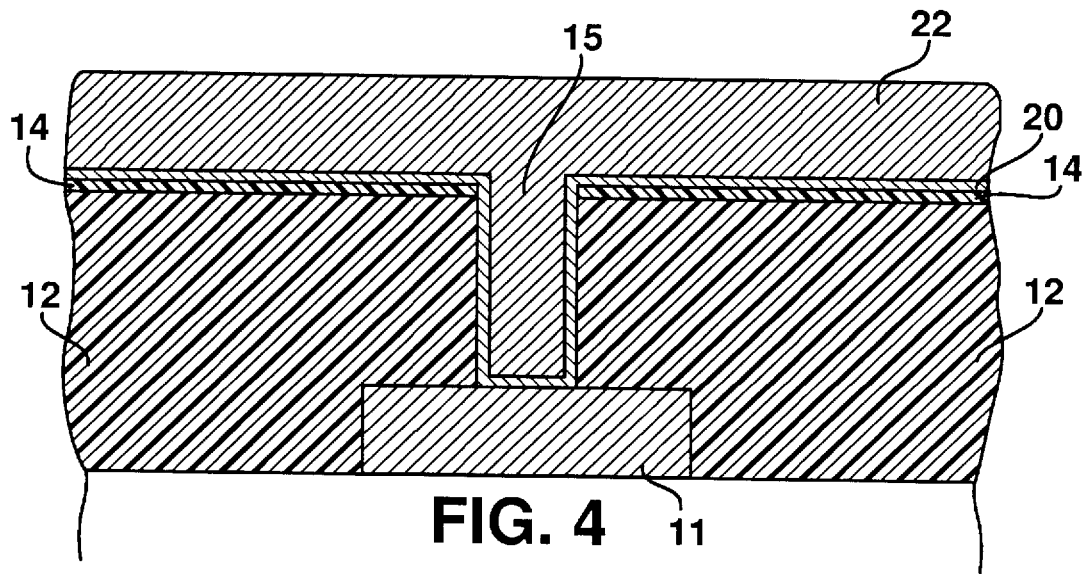
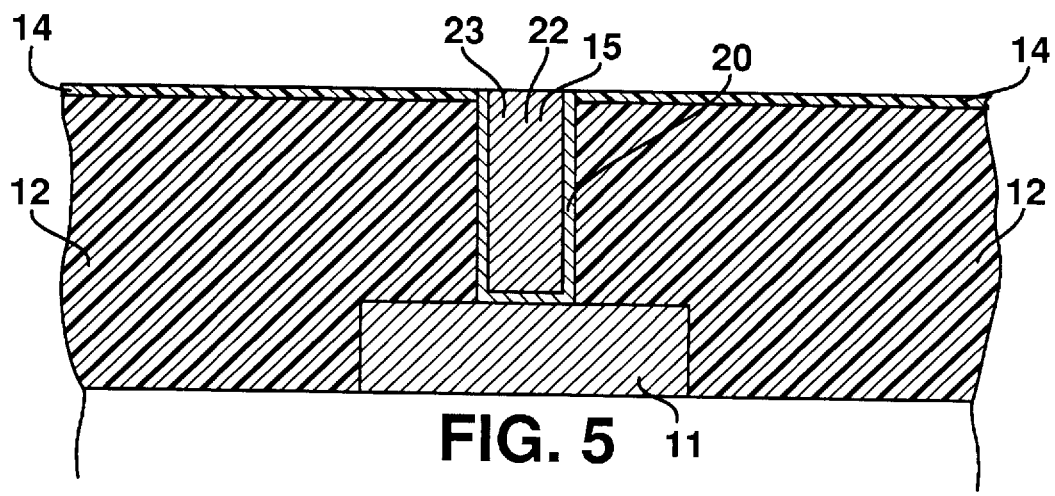
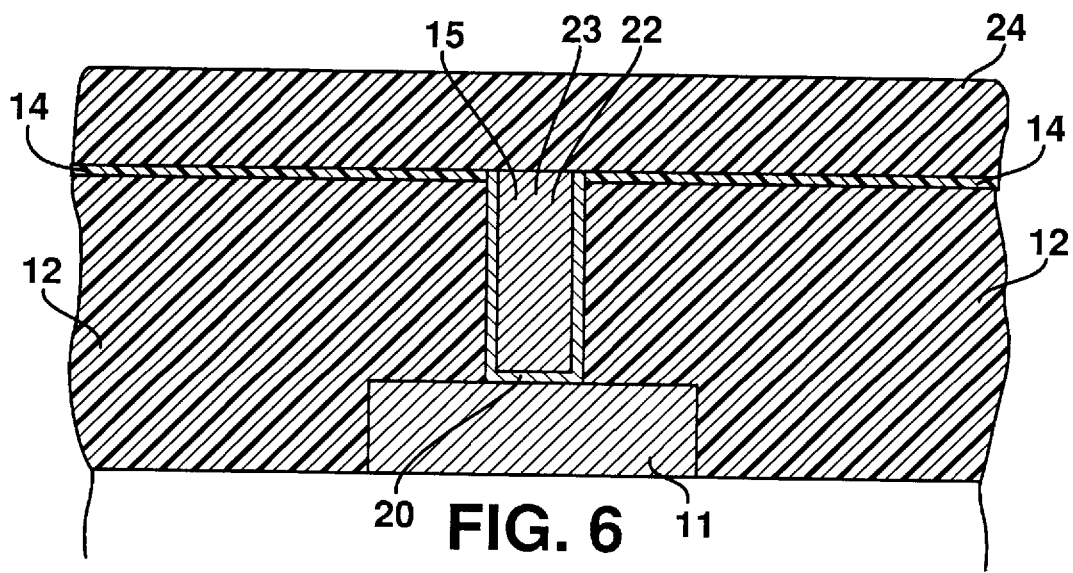

ELECTROLESS CU DEPOSITION ON A BARRIER LAYER BY CU CONTACT DISPLACEMENT FOR ULSI APPLICATIONS

BACKGROUND OF THE INVENTION

1. Field of the Invention

The present invention relates to the field of semiconductor manufacturing techniques and, more particularly, to a technique for fabricating copper interconnects by electroless metallization.

2. Prior Art

In the manufacture of devices on a semiconductor wafer, it is now the practice to fabricate multiple levels of conductive (typically metal) layers above a substrate. The multiple metallization layers are employed in order to accommodate higher densities as device dimensions shrink well below one micron design rules. Thus, semiconductor "chips" having three and four levels of metallization are becoming more prevalent as device geometries shrink to sub-micron levels.

One common metal used for forming metal lines (also referred to as wiring) on a wafer is aluminum. Aluminum is used because it is relatively inexpensive compared to other conductive materials, it has low resistivity and is also relatively easy to etch. Aluminum is also used as a material for forming interconnections in vias to connect the different metal layers. However, as the size of via/contact holes is scaled down to a sub-micron region, the step coverage problem appears, which has led to reliability problems when using aluminum to form the interconnection between different wiring layers. The poor step coverage in the sub-micron via/contact holes result in high current density and enhance the electromigration.

One approach to providing improved interconnection paths in the vias is to form completely filled plugs by utilizing metals, such as tungsten. Thus, many semiconductor devices fabricated utilizing the current state of VLSI (Very Large Scale Integration) technology employ the use of aluminum for the wiring and tungsten plugs for providing the interconnection between the different levels of wiring. However, there are disadvantages of using tungsten as well. Mostly, tungsten processes are complicated and appreciably expensive. Tungsten also has high resistivity. The Joule heating may enhance the electromigration of adjacent aluminum wiring. Furthermore, tungsten plugs are susceptible to the presence of voids and form poor interface with the wiring layers which usually result in high contact resistance. Another solution for the plug interconnects is the use of aluminum plugs, which can be fabricated by chemical vapor deposition (CVD) or physical vapor deposition (PVD) at elevated temperatures. The CVD aluminum is proven to be expensive and the hot PVD aluminum usually requires very high process temperatures that sometimes is not compatible with the manufacturing of integrated circuits.

One material which has received considerable attention as a replacement material for VLSI interconnect metallizations is copper. Since copper has better electromigration property and lower resistivity than aluminum, it is a more preferred material for interconnect (plugs and wiring) formation than aluminum. In addition, copper has improved electrical properties than tungsten, making copper a desirable metal for use as plugs. However, one serious disadvantage of using copper metallization is that it is difficult to etch. Thus, where it was relatively easier to etch aluminum or tungsten after depositing them to form wiring lines or plugs (both wiring and plugs are referred to as interconnects), substantial additional cost and time are now required to etch copper.

One typical practice in the art is to fabricate copper plugs and wiring by inlaid (Damascene) structures by employing CMP (see for example, U.S. Pat. No. 4,789,648). However, since copper diffuse/drift easily in inter-level-dielectric (ILD) materials, such as $SiO_2$ based ILD materials, copper interconnect structures must be encapsulated by diffusion barrier layers. (See for example, "Barriers Against Copper Diffusion into Silicon and Drift Through Silicon Dioxide;" Shi-Qing Wang; MRS Bulletin; August 1994; pp. 30–40; "Encapsulated Copper Interconnection Devices Using Sidewall Barriers;" Donald S. Gardner et al.;1991 VMIC Conference; Jun. 11–12, 1991; pp. 99–108; and "Copper Interconnection with Tungsten Cladding for ULSI;" J. S. H. Cho et al.; VLSI Symposium; 1991; pp. 39–40). Accordingly, it is a common practice to use diffusion barrier metals, such as titanium nitride (TiN) or titanium tungsten (TiW), as well as dielectric barrier materials, such as silicon nitride (SiN), to encapsulate copper. Typically, the use of diffusion barrier material to encapsulate copper is not limited to the copper-ILD interface, but also to interfaces with other metals as well, if there are other such metals.

To replace the tungsten and/or aluminum interconnect structures with copper interconnects in VLSI (or ULSI) manufacturing, another important factor to consider is the process cost. One technique of depositing copper, as well as other metals, is the use of electroless deposition (See for example, "Electroless Cu for VLSI;" James S. H. Cho et al.; MRS Bulletin; June 1993; pp. 31–38; "Selective Electroless Metal Deposition For Integrated Circuit Fabrication;" Chiu H. Ting et al.; J. Electrochem. Soc., 136; 1989; p. 456 et seq.; "Selective Electroless Metal Deposition For Via Hole Filling In VLSI Multilevel Interconnection Structures;" Chiu H. Ting et al.; J. Electrochem. Soc., 136; 1989; p.462 et seq.; and U.S. Pat. No. 5,240,497).

In comparison to other copper deposition techniques, electroless copper deposition is attractive due to the low processing cost and high quality of copper deposited. The equipment for performing electroless metal deposition are relatively less expensive, as compared to other semiconductor equipment for depositing metals, and the technique allows for batch processing of wafers. Thus, overall cost can be reduced by using electroless deposition. However, electroless deposition requires the activation of a surface in order to electrolessly deposit the copper. (See for example, U.S. Pat. No. 4,574,095; "Electroless Copper Deposition on Metals and Silicides;" Cecilia Y. Mak; MRS Bulletin; August 1994; pp. 55–62; and "Development Of An Electroless Copper Deposition Bath For Via fill Applications On TiN Seed Layers;" Palmans et al.; Conference proceedings, ULSI-X, Materials research Society; 1995; pp. 87–94). Furthermore, since copper interconnects require isolation from adjacent material, the electroless deposition of copper must usually be performed on a barrier layer. Thus, where activation is required to electrolessly deposit copper, such activation will need to be performed on a barrier layer (such as TiN) or on a seed metal residing above such a barrier layer, in order to isolate the copper from the surrounding dissimilar material.

The present invention describes a technique of utilizing electroless metallization to form copper interconnect structures by employing copper as an activation agent on a barrier metal to initiate the autocatalytic process in fabricating multilevel semiconductor devices.

SUMMARY OF THE INVENTION

The present invention describes a method for utilizing electroless copper deposition to form interconnects on a semiconductor. Once a via or a trench is formed in a dielectric layer, a titanium nitride (TiN) or tantalum (Ta) barrier layer is blanket deposited. Then, a contact displacement technique is used to form a thin activation layer of copper on the barrier layer. After the contact displacement of copper on the TiN, an electroless deposition technique of the present invention is then used to auto-catalytically deposit copper on the activated barrier layer. The electroless copper deposition continues until the via/trench is filled. Subsequently, the copper is polished by an application of chemical-mechanical polishing (CMP) to remove excess copper from the surface, so that the only copper remaining are in the via/trench openings. Then an overlying silicon nitride (SiN) layer is formed above the exposed copper in order to form a dielectric barrier layer. The copper interconnect is fully encapsulated from the adjacent material by the TiN (or Ta) and the SiN layers.

In one embodiment, electroless copper deposition technique is used to form plugs in via openings. In another embodiment, the electroless copper deposition technique is used to form wiring in trench openings. Still in another embodiment employing the dual Damascene structure, both plugs and wiring are formed during the same electroless copper deposition process. In all instances, autocatalytic process for the electroless deposition of copper is commenced by the formation of a seed layer formed from copper utilizing a contact displacement technique.

BRIEF DESCRIPTION OF THE DRAWINGS

FIG. 4 is a cross-sectional view of the structure of FIG. 3 in which copper is electrolessly deposited on the activated barrier layer.

FIG. 5 is a cross-sectional view of the structure of FIG. 4 in which the excess copper above the ILD is polished away by performing CMP.

FIG. 6 is a cross-sectional view of the structure of FIG. 5 in which an overlying dielectric layer is formed above the copper formation in the via opening.

DETAILED DESCRIPTION OF THE PREFERRED EMBODIMENTS

A technique for utilizing electroless metallization to form copper (Cu) wiring and plug structures by copper contact displacement on a barrier metal to initiate the activation of the autocatalytic copper deposition process for fabrication of multilevel semiconductor devices is described. In the following description, numerous specific details are set forth, such as specific materials, structures, chemicals, processes, etc., in order to provide a thorough understanding of the present invention. However, it will be obvious to one skilled in the art that the present invention may be practiced without these specific details. In other instances, well known processes and structures have not been described in detail in order not to unnecessarily obscure the present invention.

Furthermore, it is appreciated that the fabrication of a multiple-metal layer structure atop a substrate, such as a silicon substrate, to manufacture a semiconductor device is well-known in the art. Generally, dielectric materials, such as silicon dioxide ($SiO_2$), are utilized to separate the conductive regions. Contact openings are formed in the dielectric overlying the substrate region to provide conductive pathways to the source, drain and gate regions from a first metal layer. Via openings are formed in the subsequent inter-level dielectric (ILD) layers separating the various metal layers to provide conductive pathways between the metal layers. One such exemplary multiple metal layer structure is described in "Planar Copper-Polyimide Back End Of The Line Interconnections For ULSI Devices;" B. Luther et al.; 1993 VMIC Conference; Jun. 8–9, 1993; pp. 15–21. Accordingly, it is appreciated that the Figures provided herein illustrate only portions of an exemplary semiconductor device which pertain to the practice of the present invention. Thus, the present invention is not limited to the structures described herein.

Figure 1:
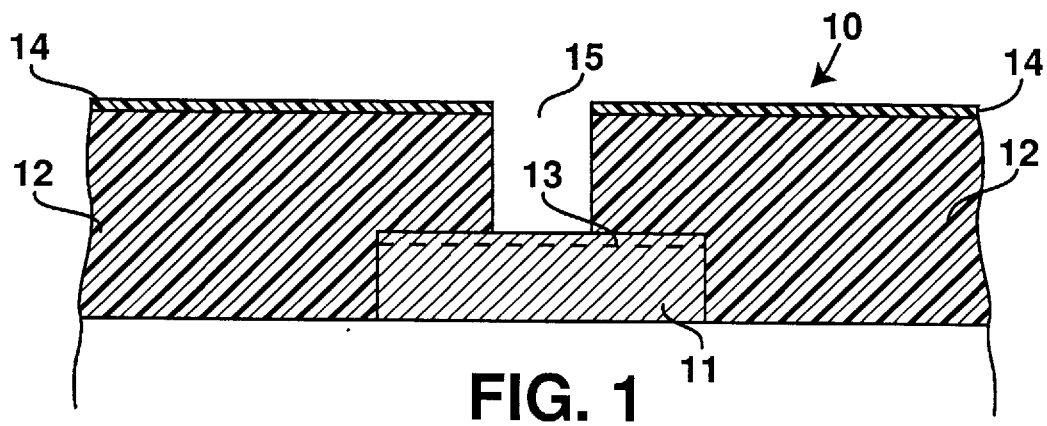
FIG. 1 is a cross-sectional view of an interconnect structure for a semiconductor device showing an underlying metal layer overlaid with an inter-level dielectric (ILD) layer, but in which a via opening is formed in the ILD layer to expose a portion of the underlying metal layer.

Referring to FIG. 1, an exemplary semiconductor structure 10 is shown having a metal layer 11 which is covered by an ILD layer 12. Metal layer 11 is representative of one of the metal layers in a multiple metal level semiconductor device. Layer 12 is typical of an ILD layer which is used to separate the different metal layers. Generally, metal layer 11 resides atop a dielectric material (which could be part of layer 12), but what comprises the underlying material is not critical to the understanding of the practice of the present invention. Also, it is understood that structure 10 is only a portion of many structures present on a semiconductor wafer.

Metal layer 11 may have a barrier layer 13 (which can also operate as an anti-reflection and/or electromigration/stress migration suppression layer) overlying the actual metal used for the wiring, but a presence of such a barrier layer 13 is also not pertinent to the practice of the present invention. Accordingly, in the subsequent Figures following FIG. 1, barrier layer 13 is not shown. However, it is understood that the present invention can be practiced with or without such a barrier (or anti-reflection or electromigration/stress migration suppression) layer 13 atop metal layer 11. One of the more preferred materials for forming layer 13 is titanium nitride (TiN).

The ILD layer 12 may have a thin etch stopping layer 14 at its upper surface. Layer 14 can also be used as a CMP stopping layer as well, so that excessive polishing of the ILD layer 12 is prevented. ILD layer 12 is typically formed from an oxide material, such as silicon dioxide ($SiO_2$). It is appreciated that other materials, such as low dielectric constant materials, polymer and polyimide materials, as well as other non-conductive materials, can be utilized for ILD layer 12. In the practice of the preferred embodiment, it is preferred to have SiN (or equivalent material) as dielectric layer 14. A typical approximate thickness of the SiN layer 14 is 1000 angstroms. The depositing of SiN, such as by CVD, is known in the art.

Subsequently, by the use of a known process, a via opening 15 (also referred to as via hole or via) is made in ILD 12 in order to provide a pathway to metal layer 11. The via opening 15 will be eventually filled with a conductive material to form a plug interconnect between metal 11 and an overlying metal layer which will be formed above the ILD layer 12. It is appreciated that the structure 10 of FIG. 1 can be fabricated from a variety of known processes.

Figure 2:
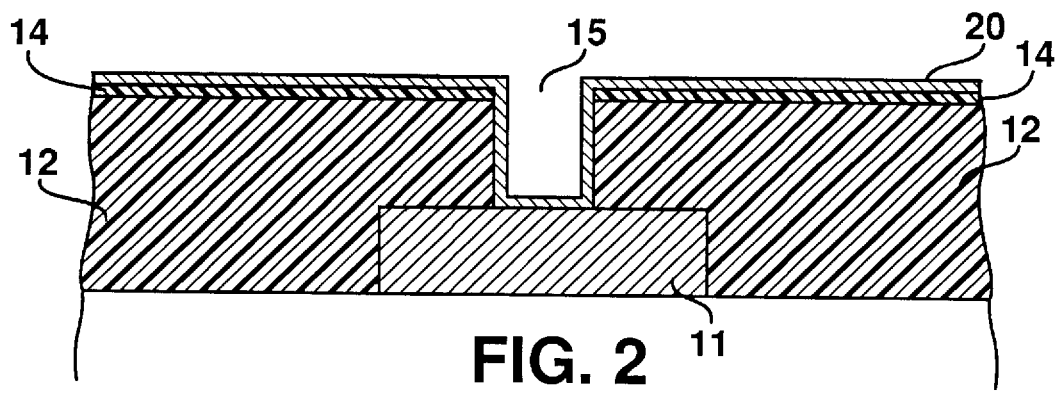
FIG. 2 is a cross-sectional view of the structure of FIG. 1 in which a barrier layer is blanket deposited over the ILD and in the via opening.

Referring to FIGS. 2–7, a technique of the present invention for forming a copper plug by a technique of contact displacement to initiate an autocatalytic reaction of copper is described. In FIG. 2, a barrier metal layer 20 is shown blanket deposited onto the structure 10 of FIG. 1. The preferred material for the barrier layer 20 is titanium nitride (TiN) or tantalum (Ta). However, it is appreciated that other materials can be used for barrier layer 20 in the practice of the present invention. The barrier layer 20 is conformally deposited by a known technique, such as chemical vapor deposition (CVD) or physical vapor deposition (PVD). If the barrier layer 20 is TiN, then CVD or PVD can be used for the deposition of TiN. If the barrier layer 20 is Ta, then PVD can be used for the conformal deposition of Ta. A common practice for performing PVD is by sputtering. Generally, barrier layer 20 is deposited to a thickness in the approximate range of 50–1500 angstroms. It is to be noted that in some instances, an adhesion promoter layer is desirable (but optional) prior to the depositing of the barrier layer 20, in order to improve the adhesion bond between the barrier layer 20 and the underlying ILD. A common material for such an adhesion promoter layer is titanium (Ti).

Figure 3:
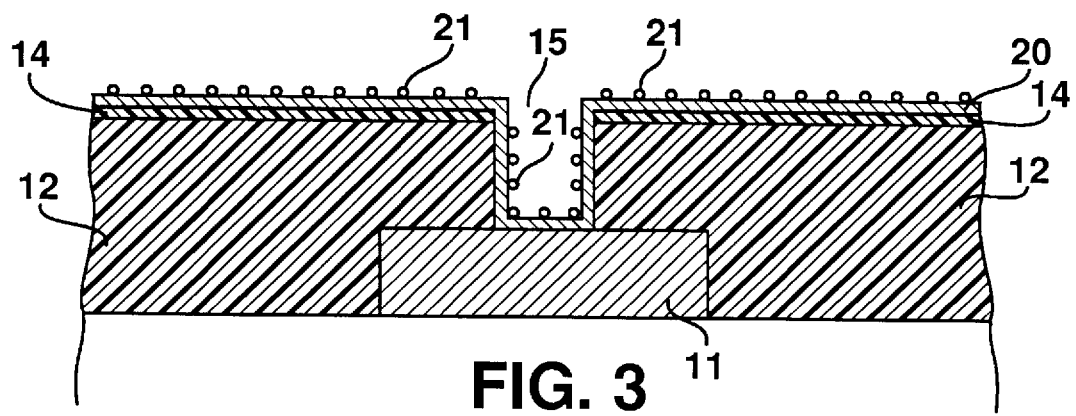
FIG. 3 is a cross-sectional view showing an activation of the barrier layer of FIG. 2 by copper contact displacement to form a copper activation layer on the barrier layer.

Referring to FIG. 3, it shows a technique of the present invention to activate the surface of barrier layer 20 by a method of contact displacement. As is known in the art, activation of a metal is necessary in order to pursue the autocatalytic reaction for the electroless deposition of copper. A number of techniques are known for treating a metal surface in order to make the surface susceptible for the autocatalytic reaction. The use of palladium (or palladium seed) is one known technique for treating a surface to initiate the autocatalytic reaction of copper. (See for example, "Development Of An Electroless Copper Deposition Bath For Via Fill Applications On TiN Seed Layers;" Palmans et al.; Conference Proceedings, ULSI-X; materials Research Society; 1995; pp. 87–94). However, a problem of this one technique resides in the use of palladium (Pd). The presence of Pd will reduce the stability of electroless Cu deposition solution and the formation of CuPd alloy increases the resistivity of electroless Cu deposits.

The present invention instead uses copper to activate the TiN or Ta surface 20 by the method of contact displacement. It is appreciated that the preferred material for the barrier layer 20 is TiN or Ta, but other metallic materials can be readily adapted for use as barrier layer 20, provided the copper activation of the surface of layer 20 can be achieved by contact displacement. The surface of the barrier layer 20 is activated by having a formation of copper atoms 21 attach to the surface by contact displacement, as is shown in FIG. 3. The contact displacement occurs wherever the barrier layer 20 surface is subjected to the activation solution and not just in the via opening 15.

In the practice of the present invention, the wafer (incorporating the structure) is subjected to one of two techniques for the formation of the copper activation layer 21 on the surface of the barrier layer 20. The wafer can be dipped in a wet bath containing a contact displacement deposition solution (technique of immersion deposition) or the wafer can be placed on a rotating chuck where the contact displacement solution is injected on to the rotating wafer (technique of spin or shower deposition).

With either technique noted, a variety of solutions acceptable for semiconductor use to permit copper atoms 21 to adhere to the surface of the barrier layer 20 by contact displacement can be used. In the preferred embodiment, the aqueous contact displacement solution is formed having deionized (DI) water as the main component of the solution. The various chemicals noted below are then added to the DI water in quantities noted. The solution is further comprised of 0.001–2 mol/liter of $Cu^{+2}$ ions, 0.001–5 mol/liter of $F^-$ ions and 0.01–10 gm/liter of surfactant material. The particular solution utilized in the practice of the present invention includes copper sulfate ($CuSO_4$) and hydrofluoric acid (HF) to provide the copper and fluorine ions. The particular surfactant used in the solution is comprised of RHODAFAC RE 610 (manufactured by Rhone-Poulenc), polyethylene glycol and Triton X-100 (both manufactured by Aldrich). The exposed TiN or Ta is subjected to this solution for a time period of approximately 1°–600 seconds at a temperature in the approximate range of 18–25° C. The parameters can be varied, but ultimately it is desirable to form the copper activation layer 21, having at least a mono-layer of copper atoms to cover the surface of barrier layer 20. Then, the wafer is removed from the contact displacement solution and rinsed in DI water.

It is appreciated that by utilizing the above contact displacement process, the copper activation layer 21 is formed on the surface of the barrier layer 20, so that now an auto-catalytic deposition of electrolessly deposited copper can occur on the surface of the barrier layer 20, once the wafer is placed in an electroless deposition solution. It is to be noted that the contact displacement technique is described in reference to the use of either TiN or Ta (since TiN and Ta are the preferred materials for barrier layer 20) for practicing the present invention, but the same contact displacement technique can be used with other metallic barrier materials as well to activate the barrier surface for copper deposition.

Examples of metals, other than TiN or Ta, in which copper activation can occur by contact displacement are Al, AlCu, AlSiCu, Ti, W, TiW, TaN and WN. Thus, depending on the purpose and the process, layer 20 can be comprised of one of these other materials, instead of TiN or Ta. After the activation process, the wafer is rinsed in DI water to remove the activation solution. Copper activation of a barrier layer by contact displacement is also described in a patent application titled "Selective Electroless Copper Deposited Interconnect Plugs For ULSI Applications;" Ser. No. 08/587,263; filed Jan. 16, 1996, now U.S. Pat. No. 5,674,787, which is incorporated by reference herein.

Subsequently, as shown in FIG. 4, copper is deposited by the technique of electroless copper deposition. The electroless deposition of copper occurs at those locations where copper atoms 21 have activated the barrier layer surface. Thus, as shown in FIG. 4, a blanket growth of electrolessly deposited copper 22 forms above layer 20, including the filling of via opening 15. One of a variety of known electroless copper deposition solutions can be utilized to electrolessly deposit copper on layer 20. However, with the practice of the present invention, the electroless copper deposition is performed in the following solution. The copper layer 22 is electrolessly deposited until a sufficient layer of copper forms above barrier layer 20 so as to completely fill via 15.

The electroless solution of the preferred embodiment is comprised of copper sulfate to supply the $Cu^{2+}$ cations, ethylenediaminetetraacetic acid (EDTA) as a complexing agent for $Cu^{2+}$ cations, quaternary ammonium hydroxides or potassium hydroxide (KOH) to supply the $OH^-$, formaldehyde (HCHO) or glyoxylic acid as a reducing agent, RHODAFAC RE 610 or polyethylene glycols as a surfactant and wetting agent, and ammonium cyanide or 2,2"-dipyridyl as stabilizer and ductility promoter.

The particular solution concentration for the solution of the preferred embodiment is mixed in DI water and is comprised of 0.016–0.08 mol/liter of copper sulfate ($CuSO_4$), 0.04–0.2 mol/liter of EDTA, 0.13–1 mol/liter of formaldehyde, 0.06–0.2 mol/liter of glyoxylic acid, 0.01 mol/liter of ammonium cyanide, 10–120 parts-per-million (ppm) of 2,2'-dipyridyl, 50–100 ppm of polyethylene glycol and 0.01–10 gm/liter of RHODAFAC RE 610. Also, sufficient tetramethylammonium hydroxide (TMAH) or potassium hydroxide is added to adjust the pH of the solution to a range of 11–13. The electroless bath is maintained at a temperature in the range of 30°–80° C.

The amount of reducing agent and complexing agent are dependent upon the amount of cupric ions present in the solution. Electroless copper deposition reaction can be expressed as:

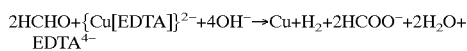
$$2HCHO + \{Cu[EDTA]\}^{2-} + 4OH^- \rightarrow Cu + H_2 + 2HCOO^- + 2H_2O + EDTA^{4-}$$

According to the above equation, the ratio between the components in the solution must be in molar as:

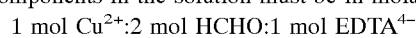
$$1 \text{ mol } Cu^{2+} : 2 \text{ mol } HCHO : 1 \text{ mol } EDTA^{4-}$$

After the electroless deposition of copper, the wafer is rinsed in DI water again to remove the electroless deposition solution.

Then, as shown in FIG. 5, the excess copper 22 is removed so that the only copper remaining forms a copper plug 23 within via opening 15. Although an etch-back process known in the art can be used, the preferred technique is to polish using CMP. CMP is employed to polish away the copper layer 22 and barrier layer 20 above the ILD layer 12. The SiN layer 14 operates as a CMP stop in this instance, so that the polishing process will stop when layer 14 is reached. Thus, the only remaining copper 22 and barrier layer 20 are within via 15 to form the plug 23.

Next, as shown in FIG. 6, a dielectric layer 24 is formed over the copper plug 23 and ILD 12 (including any remaining SiN layer 14). The dielectric layer 24 is similar to ILD layer 12 in that it is typically formed from an oxide material, such as silicon dioxide ($SiO_2$). It is appreciated that other materials, such as low dielectric constant materials, polymer and polyimide materials, as well as other non-conductive materials, can be utilized for layer 24.

Figure 7:
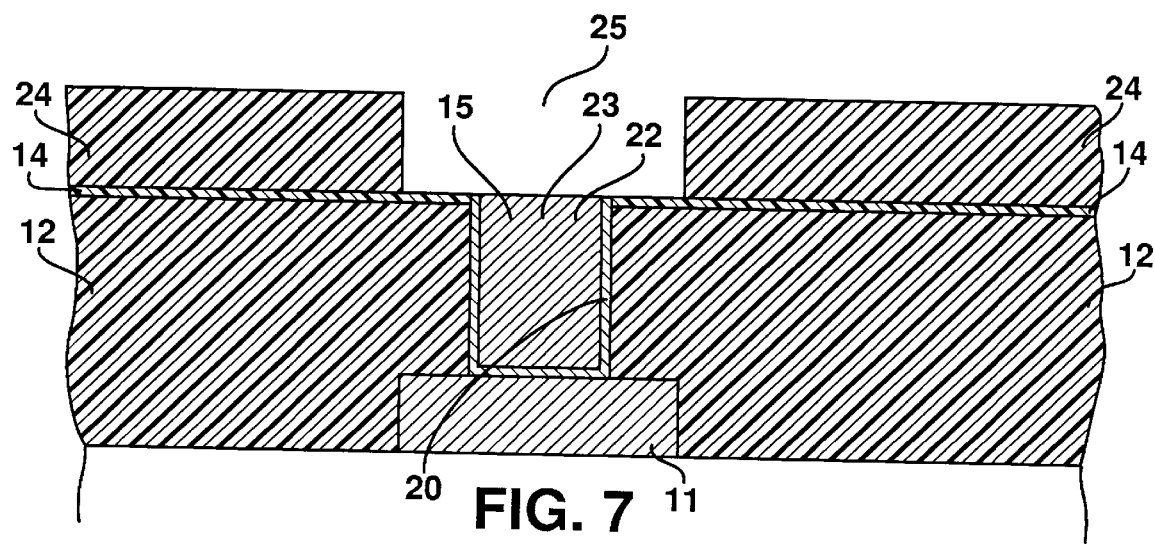
FIG. 7 is a cross-sectional view of the structure in FIG. 6 in which a trench opening is formed in the overlying dielectric layer to obtain access to the copper filled via.

Then, as shown in FIG. 7, a trench opening 25 is formed in the dielectric layer 24 to expose the plug 23 by utilizing one of a variety of known etching techniques to form trench 25. In this instance, SiN layer 14 serves as an etch stop during the etching step to form trench 25. An upper level metal layer will then be formed within trench 25. Thus, plug 23 will function as an interconnect between the lower metal layer 11 and the upper metal layer which will be formed within trench 25. As noted, the barrier layer 20 functions to isolate the copper plug 23 from the surrounding ILD 12 so that copper diffusion will not occur into the adjacent ILD 12. The barrier layer 20 also functions as a barrier layer atop metal layer 11 at the bottom of the via. Thus, plug 23 is fully encapsulated in via 15, except at the top where it contacts the metal in trench 25.

Figure 8:
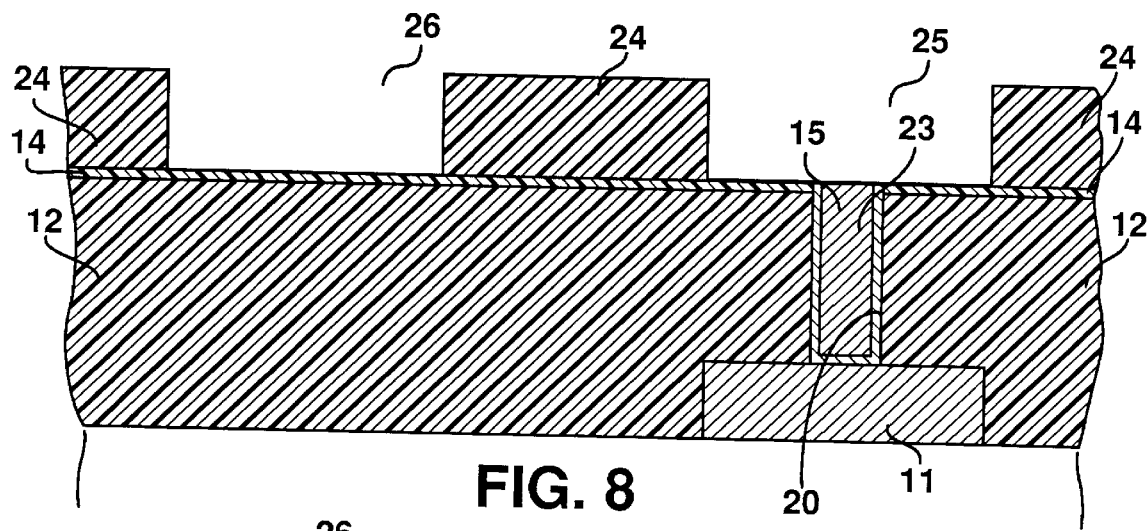
FIG. 8 is a cross-sectional view of an interconnect structure for a semiconductor device showing a formation of two trenches for laying wiring lines and in which one of the trenches has an underlying via for an interconnection to a lower metal layer, which is separated from the trench formation by an ILD layer.

Referring to FIGS. 8–13, an alternative embodiment is shown in which the electroless copper deposition technique of the present invention is used to deposit copper in trench regions of an interconnect structure. In FIG. 8, two trenches 25 and 26 are shown formed above ILD layer 12. As noted, SiN layer 14 may be present at the upper surface of ILD layer 12 to function as an etch stop. Again, it is preferred to have SiN layer 14 in the practice of the present invention. Trench 25 is equivalent to trench 26, except that it has an interconnect to a lower metallization layer 11, as illustrated in FIG. 8. The underlying interconnect structure of trench 25 is the plug 23 described above. However, it is appreciated that the following description pertaining to the electroless deposition of copper in the trenches 25–26 can be done with via interconnect structures currently known in the art. Thus, the plug underlying trench 25 could be of aluminum or tungsten (although the preference is for copper).

Figure 9:
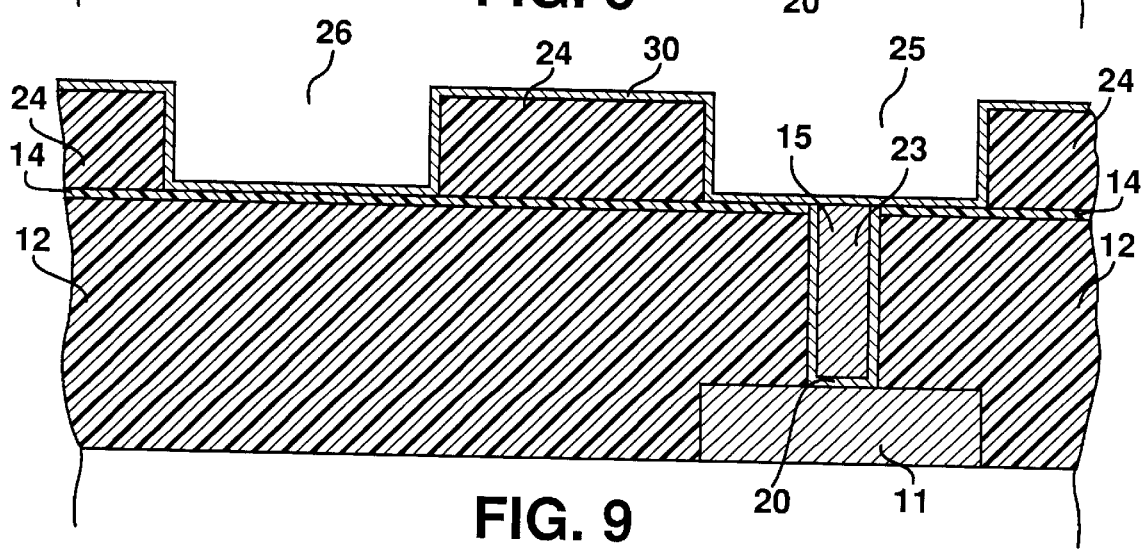
FIG. 9 is a cross-sectional view of the structure of FIG. 8 in which a barrier layer is blanket deposited over the ILD and in the trench openings.
Figure 10:
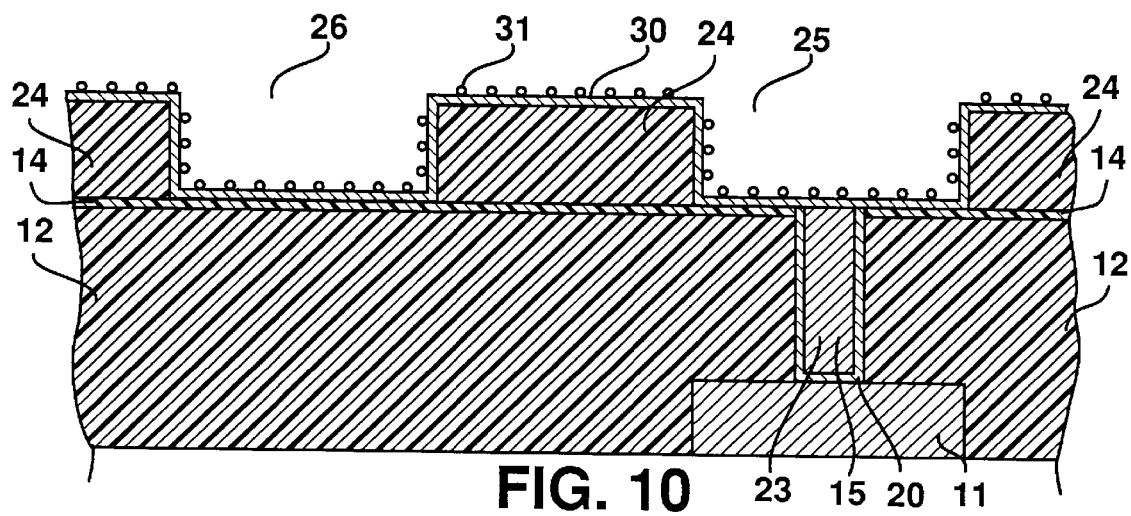
FIG. 10 is a cross-sectional view showing an activation of the barrier layer of FIG. 9 by copper contact displacement to form a copper activation layer on the barrier layer.
Figure 11:
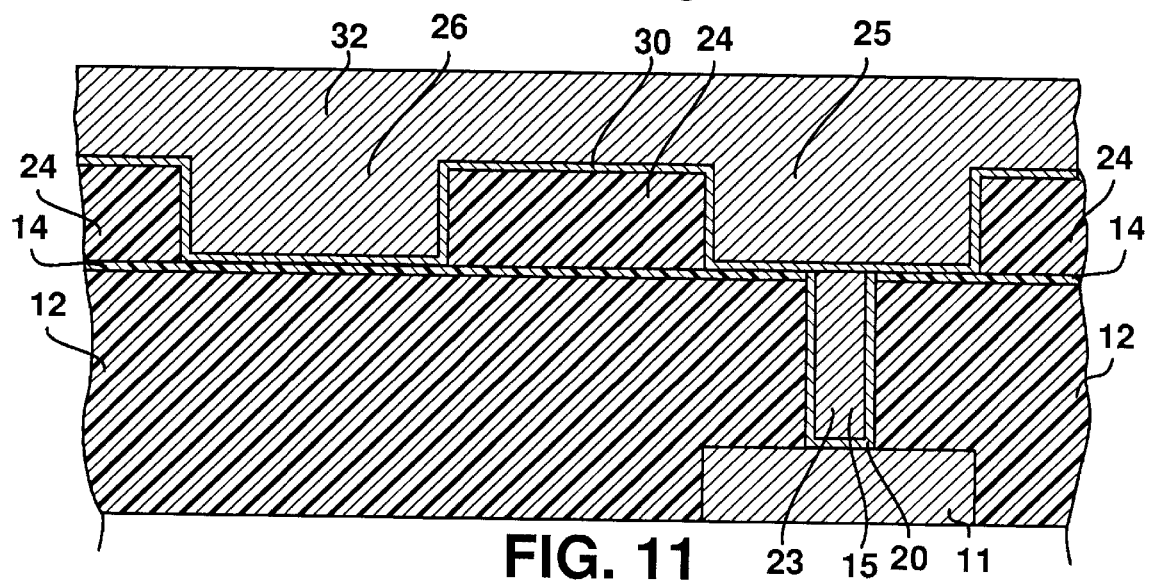
FIG. 11 is a cross-sectional view of the structure of FIG. 10 in which copper is electrolessly deposited on the activated barrier layer.

The technique for the formation of the copper in the trenches 25–26 is equivalent to the earlier described technique of forming the copper plug 23 in via 15. Accordingly, as shown in FIG. 9, a barrier layer (preferably TiN or Ta) 30 is blanket deposited above dielectric layer 24 using the technique described for the formation of barrier layer 20. Next, as shown in FIG. 10, copper activation of the barrier layer surface is achieved by copper contact displacement to form copper layer 31 on barrier layer 30 using the technique described for the formation of copper activation layer 21. After a rinse in DI water, as shown in FIG. 11, copper is deposited by the electroless technique described earlier (in reference to the formation of electrolessly deposited copper layer 22) to deposit copper layer 32. With sufficient copper deposit above barrier layer 30, copper will fill in the trenches 25–26.

Figure 12:
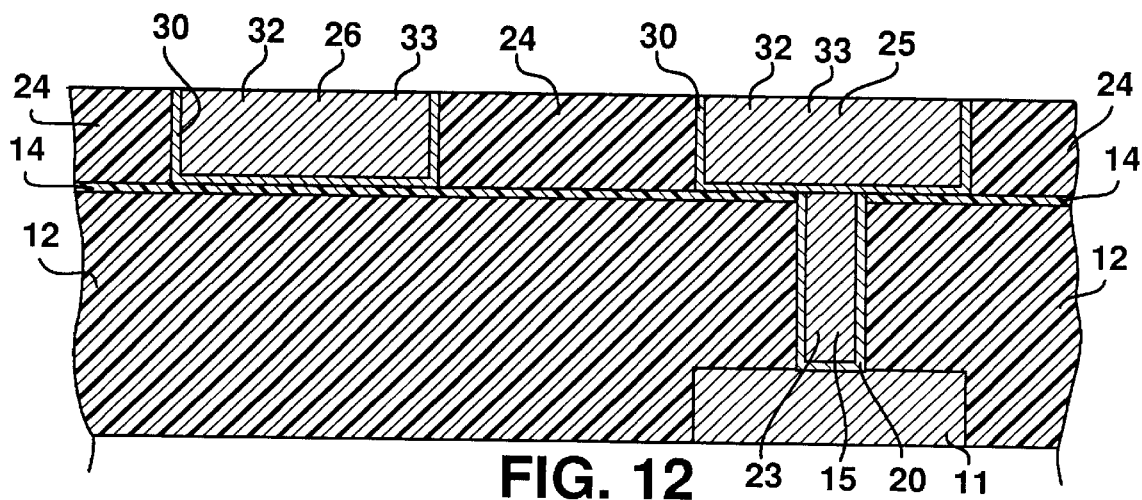
FIG. 12 is a cross-sectional view of the structure of FIG. 11 in which the excess copper and barrier layer above the ILD is polished away by performing CMP.

Subsequently after a rinse, CMP is used to polish away the excess copper 32 and barrier layer 30, so that the only copper and barrier layer material left will be in trenches 25–26, as shown in FIG. 12. The dielectric layer 24 operates as a CMP stop during the metal CMP of copper layer 32. The CMP has been described earlier in the formation of plug 23. It is optional to have a layer of SiN on top of the ILD layer 24 as a CMP stop layer. The copper left in trenches 25–26 now form copper contact lines 33 with the barrier material functioning as a diffusion barrier between the copper wiring 33 and the dielectric 24.

Figure 13:
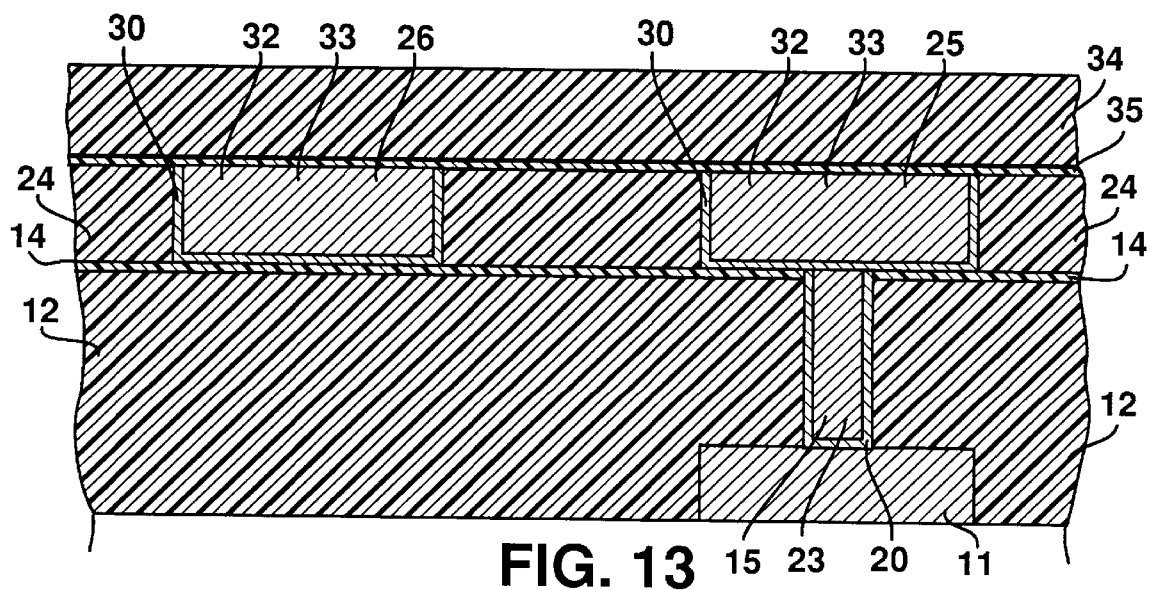
FIG. 13 is a cross-sectional view of the structure of FIG. 12 in which overlying dielectric layers are formed above the copper formation in the trench openings.

Then, as shown in FIG. 13, a subsequent ILD layer 34 can then be formed equivalent to the formation of ILD layer 12. However, prior to the formation of ILD 34, it is necessary to deposit a SiN layer 35, typically by CVD. The SiN layer 35 covers the copper wiring 33 in trenches 25–26 and this layer 35 functions as a dielectric barrier layer to encapsulate the copper 33. Vias then can be formed in ILD 34 for further interconnections to interconnect lines 33 to subsequently formed overlying metal layers. Thus, as noted in FIG. 13, copper wiring 33 is fully encapsulated by TiN (or Ta) and SiN so that copper 33 is isolated from adjacent materials.

Figure 14:
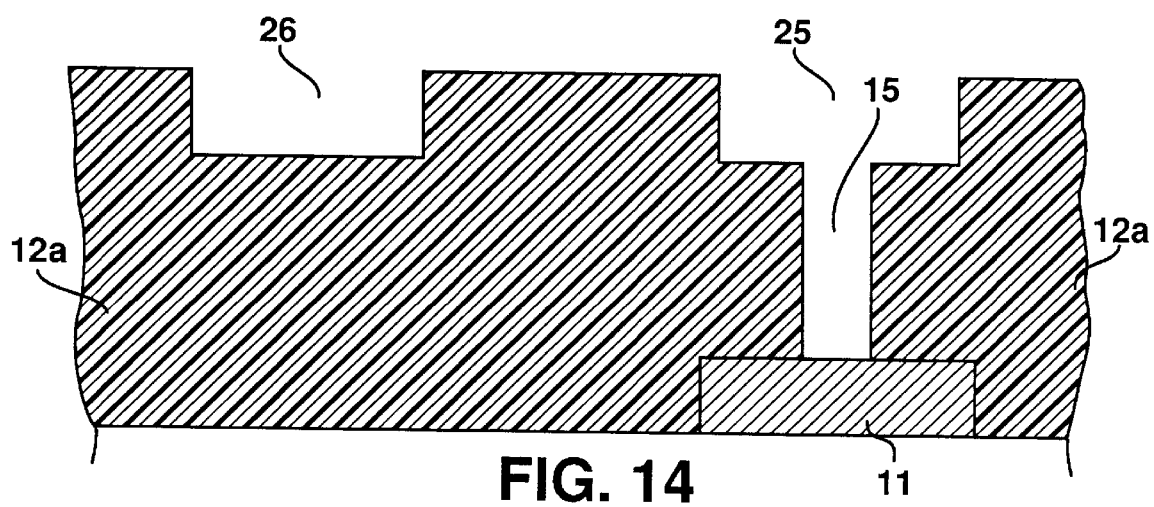
FIG. 14 is a cross-sectional view of a semiconductor device showing a formation of two trenches for laying wiring lines and in which one of the trenches has an underlying via opening for an interconnection to a lower metal layer, which is separated from the trench formation by an ILD layer.

FIGS. 14–19 illustrate still another embodiment of the present invention. In this embodiment both vias and trenches are filled together in the same processing steps using the technique of the present invention. FIG. 14 shows a structure in which trenches 25 and 26 are formed along with the formation of via 15. A structure of this sort can be fabricated utilizing a dual Damascene process (see for example, the afore-mentioned U.S. Pat. No. 4,789,648). Thus, as shown in FIG. 14, trenches 25–26 have been formed in ILD layer 12a with a via opening 15 under trench 24 for interconnection to the lower metal layer 11.

Figure 15:
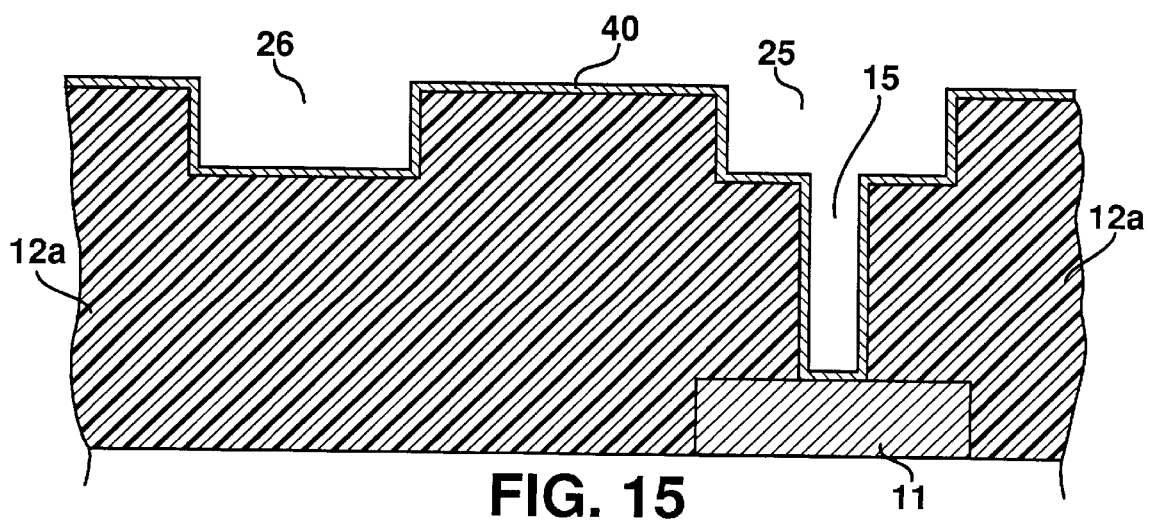
FIG. 15 is a cross-sectional view of the structure of FIG. 14 in which a barrier layer is blanket deposited over the ILD and in the trench openings and via opening.
Figure 16:
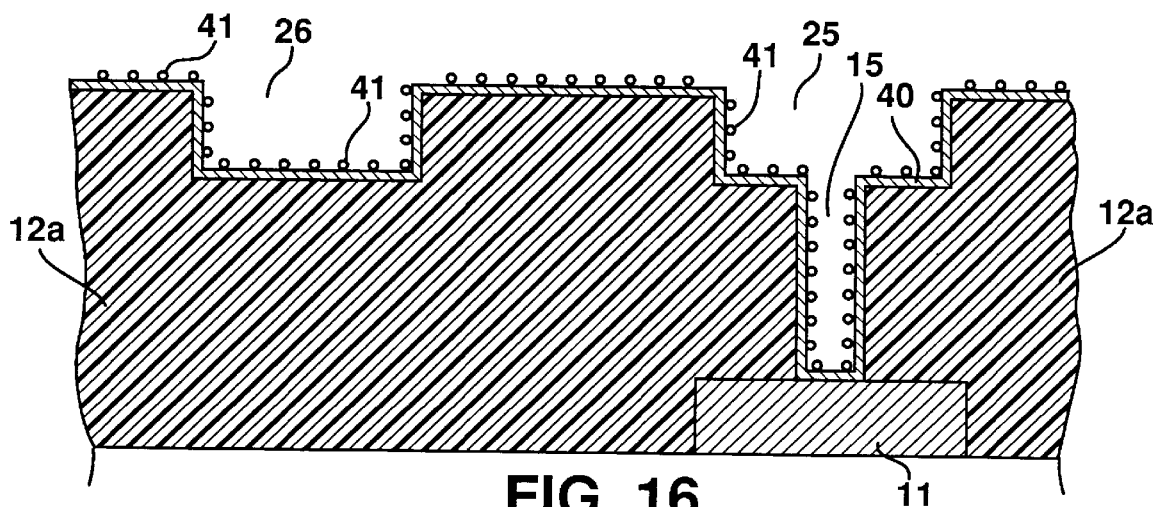
FIG. 16 is a cross-sectional view showing an activation of the barrier layer of FIG. 15 by copper contact displacement to form a copper activation layer on the barrier layer.
Figure 17:
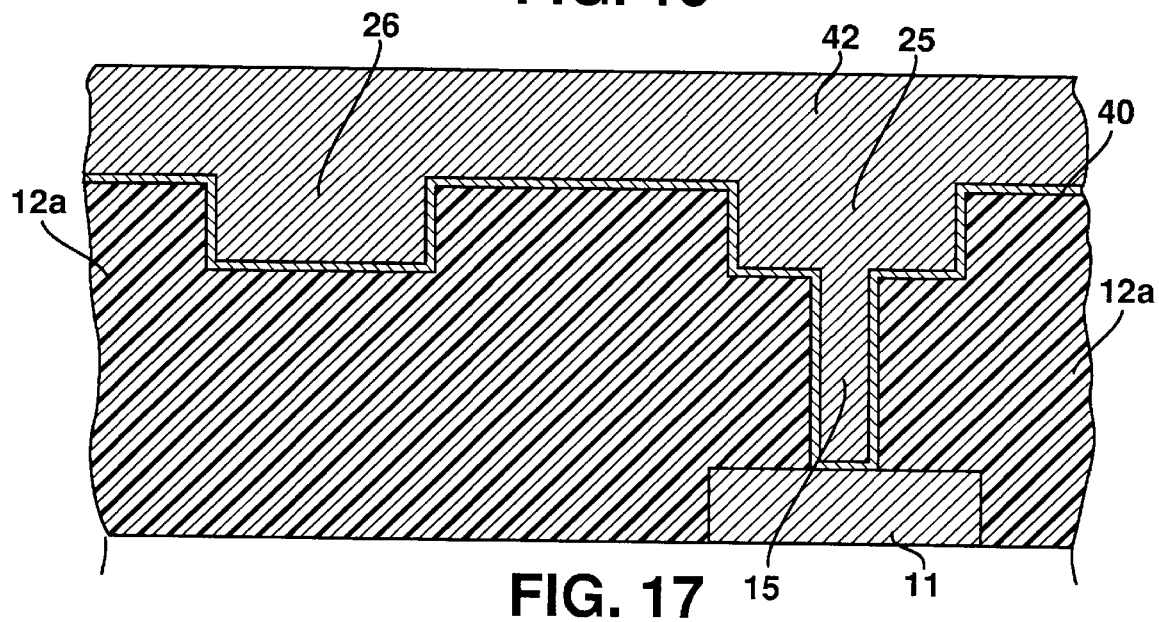
FIG. 17 is a cross-sectional view of the structure of FIG. 16 in which copper is electrolessly deposited on the activated barrier layer.

Instead of filling the via first and then the trenches next (as was described above), a barrier layer 40 is conformally deposited into all of the openings 15, 25–26 as shown in FIG. 15 using the technique described for depositing barrier layers 20 and 30. Then, as shown in FIG. 16, the barrier layer surface is activated by the copper contact displacement process described in reference to FIGS. 3 and 10 to form the copper activation layer 41. After a rinse as shown in FIG. 17, copper is electrolessly deposited to form copper layer 42 using the electroless copper deposition technique described earlier. The electrolessly deposited copper layer 42 fills via 15 and trenches 25–26.

Figure 18:
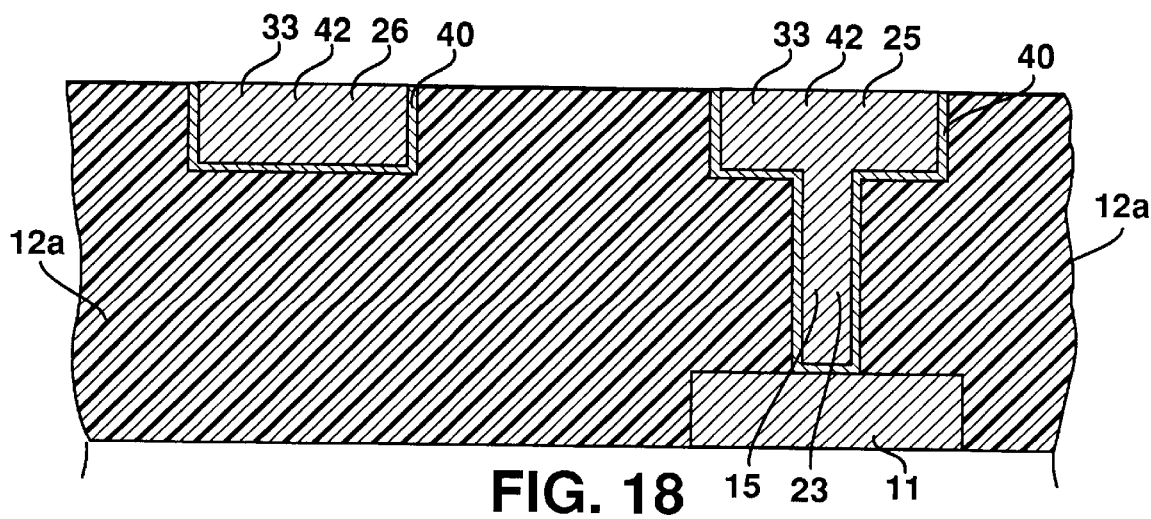
FIG. 18 is a cross-sectional view of the structure of FIG. 17 in which the excess copper and barrier layer above the ILD is polished away by performing CMP.
Figure 19:
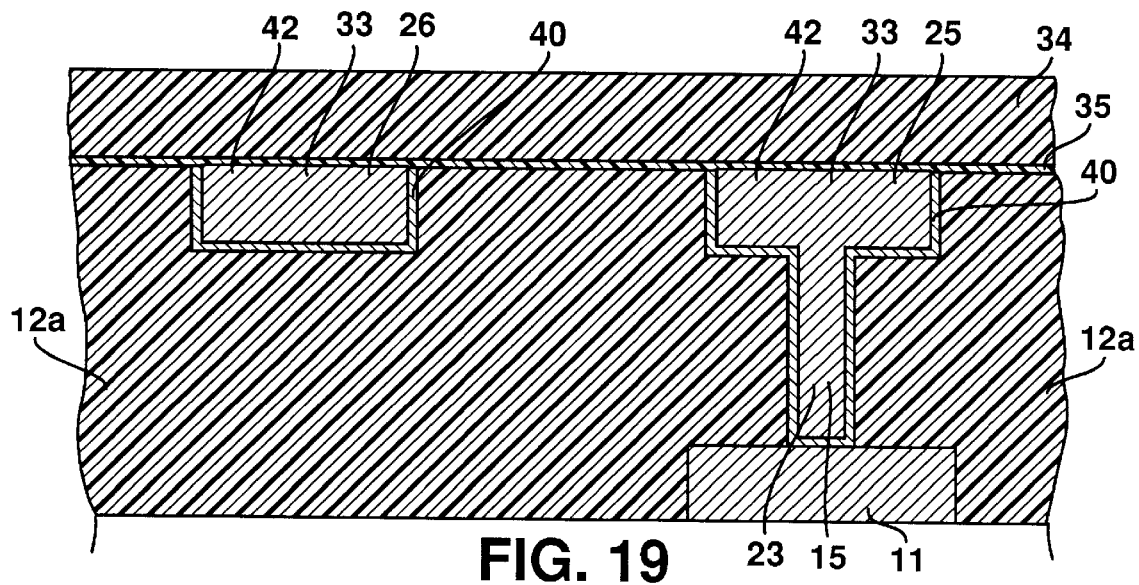
FIG. 19 is a cross-sectional view of the structure of FIG. 18 in which overlying dielectric layers are formed above the copper formation in the trench openings.

Next, after a rinse, as shown in FIG. 18, CMP is used to polish the excess copper and the barrier layer so that the only copper and barrier material left are in trenches 25–26 and via 15 to form plug 23 and lines 33. Then, the overlying SiN barrier layer 35, followed by an ILD layer 34 are formed, as is shown in FIG. 19. The copper interconnect structures, whether just the wiring as shown in trench 26 or the plug/wiring combination of via 15 and trench 25, are fully encapsulated by the TiN (or Ta) and SiN to completely isolate the copper from the adjacent material.

An advantage of utilizing the present invention with the dual Damascene structure of FIG. 14 is quite evident. The electroless copper deposition technique of the present invention can be used to fill both the via and the trenches during the same process steps, so that the process need not be repeated twice, once for the plug and the second time for the wiring.

Figure 20:
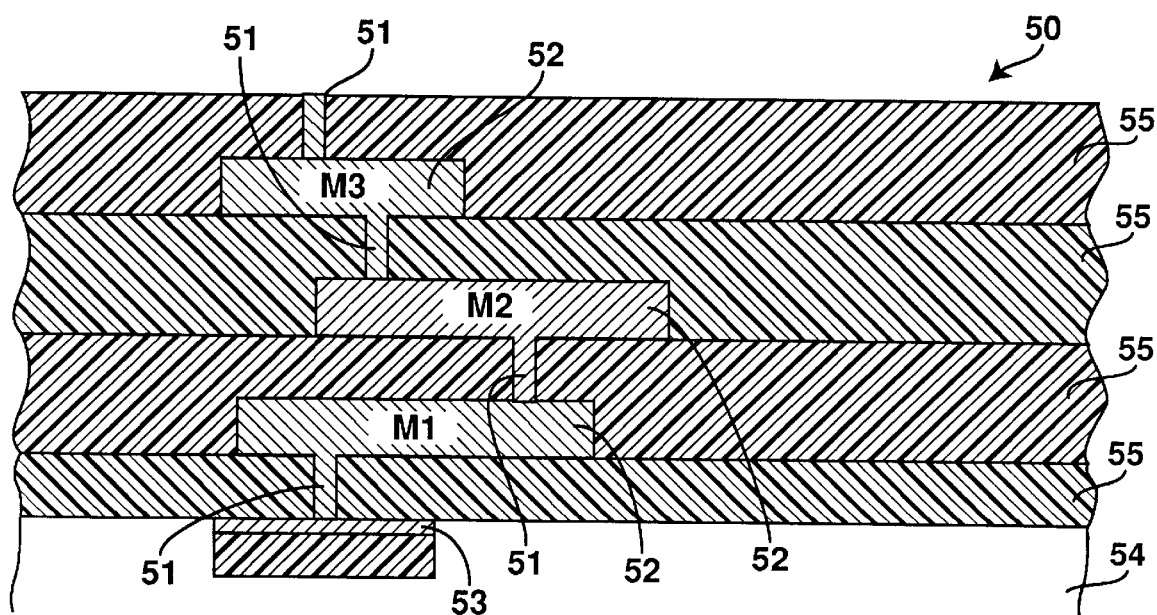
FIG. 20 is a cross-sectional view of a semiconductor device having four metal layers and a doped region in a substrate and in which via and contact openings are filled to interconnect the various conductive regions.

FIG. 20 shows a three-metal level structure 50 in which the metal levels are designated M1, M2 and M3, separated by dielectric layers 55. Plugs 51 are used to couple the metal lines 52 and the M1 level to a contact region 53 on the substrate 54. It is appreciated that the present invention can be readily used to provide for the various plugs 51 and metal lines 52 shown in FIG. 20 in the fabrication of semiconductor devices.

Accordingly, an electroless copper deposition technique is described in which advantages associated with the use of copper for conductive paths in a semiconductor device are inherently present in the practice of the present invention. The present invention is not limited to the size of the device or the via opening, but has advantages at smaller sized dimensions in the submicron range (generally in the approximate range of 0.2–0.8 $\mu$m). The electroless copper deposition can be performed as a batch process in which a substantial number of wafers can be immersed in the wet bath at the same time. Most importantly, the activation of the barrier metal (such as TiN or Ta) is achieved by the use of copper to form a seed layer for the subsequent auto-catalytic deposition of copper. Since the material for the seed layer is the same as the metal being deposited, the process is not contaminated by the use of some other material than copper for the formation of the seed layer.

Additionally, a variety of metallic barrier materials or dielectric materials can be used atop via and trench openings to encapsulate the copper. In the description, SiN is used as the preferred material for the dielectric barrier material, but other materials can be used without departing from the scope and spirit of the present invention.

Furthermore, although the present invention is described in reference to openings for forming vias and trenches, the present invention can be readily extended to contact openings as well. In that instance, the underlying region would not be a metal layer (such as described in relation to vias), but rather such underlying regions would be doped contact regions or silicide regions of a contact (see, for example, FIG. 20). Thus, interconnect structures implementing the present invention can extend to those conductive regions referred to as contacts.

Thus, a technique for utilizing electroless metallization to deposit copper using copper activation on a barrier layer is described.

We claim:

1. A method of activating a surface of a diffusion barrier layer for preventing diffusion of copper into dielectric material in order to deposit copper by electroless deposition, comprising the steps of:

subjecting said diffusion barrier layer surface to an aqueous copper contact displacement solution;

activating said diffusion barrier layer surface for autocatalytic growth of copper by forming at least a monolayer of copper atoms on said barrier layer surface by contact displacement of copper to form a copper activation seed layer on said barrier layer surface;

subjecting said copper activation seed layer to an electroless deposition solution;

depositing copper electrolessly on said diffusion barrier layer surface by having said copper activation seed layer initiate said autocatalytic growth of copper.

2. The method of claim 1 wherein said barrier layer is comprised of titanium nitride or tantalum.

3. The method of claim 2 wherein said aqueous copper contact displacement solution includes copper sulfate ($CuSO_4$) and hydrofluoric acid (HF) to provide necessary copper and fluorine ions for said contact displacement of copper to occur.

4. The method of claim 3 wherein said aqueous copper contact displacement solution is further comprised of 0.001–2 mol/liter of $Cu^{+2}$ ions, 0.001–5 mol/liter of $F^-$ ions and 0.01–10 gm/liter of surfactant material mixed in de-ionized water.

5. The method of claim 4 wherein said step of subjecting said barrier layer surface to said aqueous copper contact displacement solution occurs for approximately 1–600 seconds at an approximate temperature of 18–25 degrees C.

6. In a fabrication of a semiconductor device, a method of activating a surface of a material used as a copper diffusion barrier when disposed as a barrier layer for electroless deposition of copper, comprising the steps of:

depositing said barrier layer, wherein said barrier layer is comprised of titanium nitride or tantalum;

subjecting said surface of said barrier layer to an aqueous copper contact displacement solution;

activating said barrier layer surface for autocatalytic growth of copper by forming at least a mono-layer of copper atoms on said barrier layer surface by contact displacement of copper to form a copper activation seed layer on said barrier layer surface;

subjecting said copper activation seed layer to an electroless deposition solution;

depositing copper electrolessly on said barrier layer surface by having said copper activation seed layer initiate said autocatalytic growth of copper.

7. The method of claim 6 wherein said aqueous copper contact displacement solution includes copper sulfate (CUSO$_4$) and hydrofluoric acid (HF) to provide necessary copper and fluorine ions for said contact displacement of copper to occur.

8. The method of claim 7 wherein said aqueous copper contact displacement solution is further comprised of 0.001–2 mol/liter of Cu$^{+2}$ ions, 0.001–5 mol/liter of F$^-$ ions and 0.01–10 gm/liter of surfactant material mixed in de-ionized water.

9. The method of claim 8 wherein said step of subjecting said barrier layer to said aqueous copper contact displacement solution occurs for approximately 1–600 seconds at an approximate temperature of 18–25 degrees C.

10. In a formation of a semiconductor interconnect structure in which two conductive regions are separated by a dielectric layer and connected by said interconnect structure, a method of electrolessly depositing copper to form said interconnect structure, comprising the steps of:

forming an opening in said dielectric layer;

depositing a diffusion barrier layer in said opening, wherein said barrier layer is comprised of titanium nitride or tantalum;

subjecting said barrier layer to an aqueous copper contact displacement solution;

activating a surface of said barrier layer for autocatalytic growth of copper by forming at least a mono-layer of copper atoms on said barrier layer surface by contact displacement of copper to form a copper activation seed layer on said barrier layer;

subjecting said copper activation seed layer to an electroless deposition solution;

depositing copper electrolessly on said barrier layer by having said copper activation seed layer initiate said autocatalytic growth of copper to form said interconnect structure.

11. The method of claim 10 wherein said aqueous copper contact displacement solution includes copper sulfate (CuSO$_4$) and hydrofluoric acid (HF) to provide necessary copper and fluorine ions for said contact displacement of copper to occur.

12. The method of claim 11 wherein said aqueous copper contact displacement solution is further comprised of 0.001–2 mol/liter of Cu$^{+2}$ ions, 0.001–5 mol/liter of F$^-$ ions and 0.01–10 gm/liter of surfactant material mixed in de-ionized water.

13. The method of claim 12 wherein said step of subjecting said barrier layer to said aqueous copper contact displacement solution occurs for approximately 1–600 seconds at an approximate temperature of 18–25 degrees C.

14. The method of claim 10 wherein said barrier layer is deposited to a thickness of approximately 50–1500 angstroms.

15. The method of claim 14 wherein said interconnect structure is a plug formed in a via opening or in a contact opening.

16. The method of claim 14 wherein said interconnect structure is a metal line formed in a trench opening.

17. The method of claim 14 wherein said opening is for both via and trench fill and said interconnect structure forms both a plug and a metal line.

18. In a formation of a semiconductor interconnect structure in which two conductive regions are separated by a dielectric layer and connected by said interconnect structure, a method of electrolessly depositing copper to form said interconnect structure, comprising the steps of:

forming an opening in said dielectric layer;

depositing a diffusion barrier layer over said dielectric layer and within said opening, wherein said barrier layer is comprised of titanium nitride or tantalum;

subjecting said barrier layer to an aqueous copper contact displacement solution;

activating a surface of said barrier layer for autocatalytic growth of copper by forming at least a mono-layer of copper atoms on said barrier layer surface by contact displacement of copper to form a copper activation seed layer on said barrier layer;

subjecting said copper activation seed layer to an electroless deposition solution;

depositing copper electrolessly on said barrier layer by having said copper activation seed layer initiate said autocatalytic growth of copper;

maintaining said electroless copper depositing step until said opening is filled;

removing excess copper residing above said dielectric layer, but retaining copper within said opening;

wherein said copper retained in said opening forms said interconnect structure and in which said copper is isolated from said dielectric layer by said barrier layer.

19. The method of claim 18 wherein said aqueous copper contact displacement solution includes copper sulfate (CuSO$_4$) and hydrofluoric acid (HF) to provide necessary copper and fluorine ions for said contact displacement of copper to occur.

20. The method of claim 19 wherein said aqueous copper contact displacement solution is further comprised of 0.001–2 mol/liter of Cu$^{+2}$ ions, 0.001–5 mol/liter of F$^-$ ions and 0.01–10 gm/liter of surfactant material mixed in de-ionized water.

21. The method of claim 20 wherein said step of subjecting said barrier layer to said aqueous copper contact displacement solution occurs for approximately 1–600 seconds at an approximate temperature of 18–25 degrees C.

22. The method of claim 18 wherein said barrier layer is deposited to a thickness of approximately 50–1500 angstroms.

23. The method of claim 22 wherein said interconnect structure is a plug formed in a via opening or in a contact opening.

24. The method of claim 22 wherein said interconnect structure is a metal line formed in a trench opening.

25. The method of claim 22 wherein said opening is for both via and trench fill and said interconnect structure forms both a plug and a metal line.

* * * * *